United States Patent [19]

Kardashian

[11] 4,065,757
[45] Dec. 27, 1977

[54] THIN FILM PLATED WIRE MAGNETIC SWITCH OF ADJUSTABLE THRESHOLD

[75] Inventor: Vahram S. Kardashian, Plymouth, Minn.

[73] Assignee: Honeywell Inc., Minneapolis, Minn.

[21] Appl. No.: 693,253

[22] Filed: June 7, 1976

[51] Int. Cl.$^2$ .......................................... G11C 11/155
[52] U.S. Cl. ...................................... 365/244; 335/3; 365/136; 365/139; 365/157
[58] Field of Search ................ 340/174 PW, 174 TW, 340/174 MS, 174 PM; 335/3, 79, 215

[56] References Cited

U.S. PATENT DOCUMENTS

| 3,083,353 | 3/1963 | Bobeck | 340/174 TW |
| 3,505,657 | 4/1970 | Whitehouse | 340/174 MS |
| 3,902,167 | 8/1975 | Lutes et al. | 340/174 TW |

Primary Examiner—James W. Moffitt
Attorney, Agent, or Firm—Omund R. Dahle

[57] ABSTRACT

A threshold magnetic switch is described, with adjustable threshold level for varying applications, or for purposes of matching sensitivities of several switches in utilizing apparatus.

4 Claims, 8 Drawing Figures

THIN FILM PLATED WIRE MAGNETIC SWITCH OF ADJUSTABLE THRESHOLD

BACKGROUND OF THE INVENTION

This invention is related to a co-pending Olin S. Lutes application, Ser. No. 677,181 filed Apr. 15, 1976 entitled "Magnetic Thin Film Plated Wire Switch" and a Lutes et al U.S. Pat. No. 3,902,167, issued Aug. 26, 1975, entitled "Magnetic Thin Film Switch", both assigned to the same assignee as the present invention.

Those references are directed to a magnetic film plated wire switch. The switching element is a wire substrate which is coated with a low or zero magnetostrictive anisotropic magnetic thin film electro-deposited or electroless deposited. In the undisturbed state the magnetization of the magnetic film has a component along the wire axis. Actuator means applies an external magnetic film having a component along the axis of the wire which is sufficient to change the state of the magnetic switching element. Ouput means sense the state of the magnetic switching element.

In the instant invention, a negative magnetostriction thin-film plated wire magnetic switch is described in which the wire is tensioned to control or adjust the switching threshold level of the wire as a function of the tension applied. The present invention fills the need for an adjustable threshold on-off magnetically actuated switch which can be actuated by a relatively small external magnetic field even though applied at an arbitrarily slow rate.

DESCRIPTION

Figure 1:
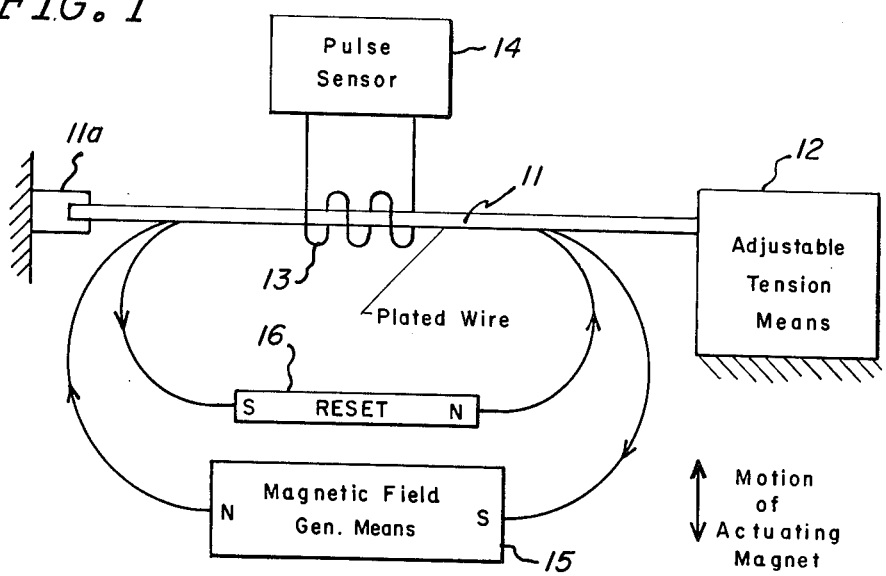
FIG. 1 shows one system embodiment of the adjustable threshold thin film plated wire magnetic switch of this invention.

In FIG. 1 an adjustable threshold thin-film plated wire magnetic switch is disclosed and comprises a length of plated wire 11 which is supported in tension by adjustable tension means 12. A sense coil 13 is wound around the plate wire 11 to sense each switching event and the sense coil is connected to a suitable pulse sensor 14. A magnetic field generating means 15, such as a permanent magnet, is movable towards and from the plated wire 11 to cause the wire to switch at the approach of the means 15. A reset magnetic field generating means 16 causes the plated wire 11 to switch back when means 15 is moved away. One or both ends of the plated wire may be secured to an electrical insulating member 11a.

Figure 3:
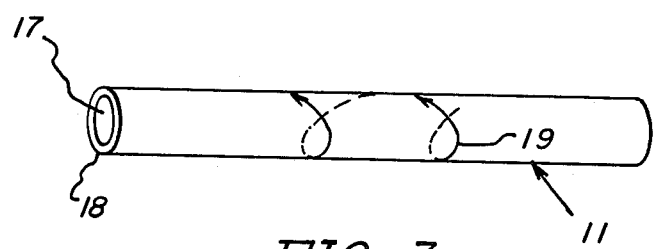
FIG. 3 shows a longitudinal section of the plated wire.

A section of the thin-film plated wire is shown in FIG. 3 in which the plating is magnetostrictive. The term magnetostriction is used to describe any dimensional change of a material which is associated with its magnetic behavior. Ferromagnetic bodies in particular are susceptible to dimensional changes, for instance, as a result of changes in temperature or a magnetic field. In the following description, the phenomenon of interest is the converse, where changes in strain on a magnetostrictive material induces a change in its magnetic behavior.

Magnetostrictive strain sensitive wires typically comprise a permalloy plating on a conductive substrate wire such as copper-beryllium. A permalloy plating is normally defined as an alloy of nickel and iron. At or about the approximate composition 80% nickel and 20% iron permalloy has a zero magnetostrictive response while an iron rich (Fe more than 20 percent) composition has a positive magnetostriction and a nickel rich (Ni more than 80 percent) composition of plating has a negative magnetostriction. In addition to selecting a positive or negative magnetostriction, the degree of magnetostriction may be selected by controlling the variance of the composition away from the zero magnetostrictive composition. In the co-pending application of Lutes, mentioned above, the permalloy film is described as being of approximate composition of 80% Ni and 20% Fe, which composition has a low or zero magnetostrictive effect. In the present invention which depends on the magnetostrictive response of the wire, it is desirable rather to select a plated wire having negative magnetostriction.

The anisotropic plated wire 11 may be, for example, a 10 mil diameter non-magnetic beryllium-copper substrate wire which has been plated with an anisotropic magnetostrictive permalloy (NiFe) film, a longitudinal-section of which is shown in FIG. 3. During deposition of the ferromagnetic film, a magnetic field is applied so that a preferred axis, called the easy axis, is obtained which is oriented helically about the wire. Pitch herein is defined as the angular measure by which the easy axis of the field is displaced from a circumferential direction. The magnetization vector may lie along this line in the absence of external fields on the wire, and makes a helix of magnetic flux around the wire dependent upon the pitch angle. The preferred pitch angle is in the range of about 15° to about 75°.

Figure 7:
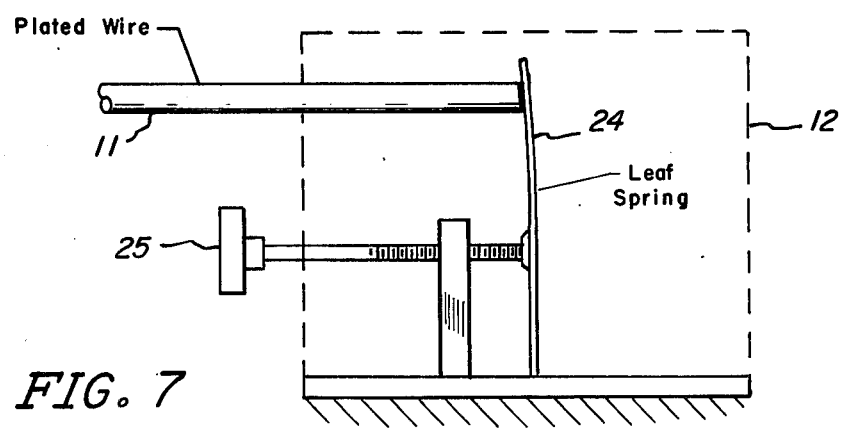
FIG. 7 shows an example of adjustable tension means.

The adjustable tension means 12 for maintaining a tension on plated wire switch 11 may take many forms. One suitable adjustable tension means is shown in FIG. 7 wherein the position of a leaf spring member 24 can be adjusted by a screw 25 to increase or decrease the tension on plated wire 11 which is fastened to leaf spring member 24.

A typical operational use of the magnetically actuated switch of this invention is as a proximity switch. The embodiment of the switch in a system as shown in FIG. 1 may be referred to as a single event switching mode. In this mode, the switch is set in one polarity (magnetization direction) prior to actuation. Broadly speaking, the switch is actuated by applying a magnetic field favoring the opposite polarity and having sufficient magnitude to exceed the coercive (threshold) value. This results in the generation of a single voltage pulse in a sense coil. Removal of the actuating field then results in resetting of the switch to the original polarity and another voltage pulse.

In FIG. 1, the actuating field may be supplied by an actuating magnet 15. The reset means may be a second magnet 16 oriented so that its component of magnetic field along the axis of plated wire switching element 11 is opposite to that of actuating magnet 15. In the absence of actuating magnet 15, the magnetic field $H_R$ of reset magnet 16 exceeds the coercive field of switching element 11 so as to keep switching element 11 in the reset polarity. As actuating magnet 15 is moved toward switching element 11, the field component $H_A$ along the axis of switching element 11 opposes that of $H_R$. When actuating magnet 15 is sufficiently close, the axial field $H_A$ overrides the axial field $H_R$ and the net axial field of $H_A$ and $H_R$ is sufficient to exceed the threshold in the opposite sense to the original polarity. When the threshold is thus exceeded, the magnetization direction in the wire is caused to switch, a voltage pulse is generated in the plated wire or in the coil around it and detected by pulse detector 14. Withdrawal of actuating magnet 15 allows the reset field $H_R$ to reset the switching element 11 to the original polarity. Reversal of the magnetization can be achieved by means of a reverse external magnetic field as described above or by a current pulse flowing into the plated wire or into a coil surrounding the wire. The current source being, for instance, a discharging capacitor.

Figure 8:
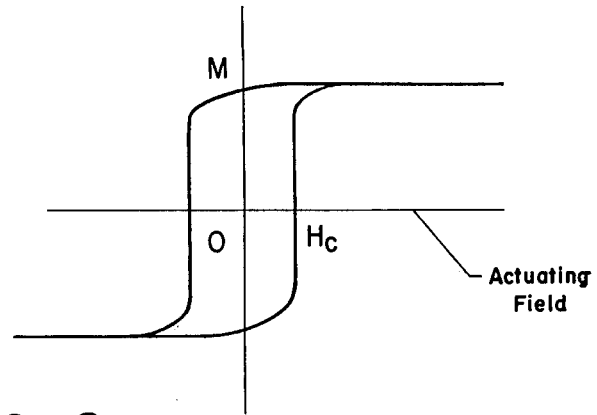
FIG. 8 shows a hysteresis loop of a thin film where the applied field is in the easy direction of magnetization.
Figure 5:
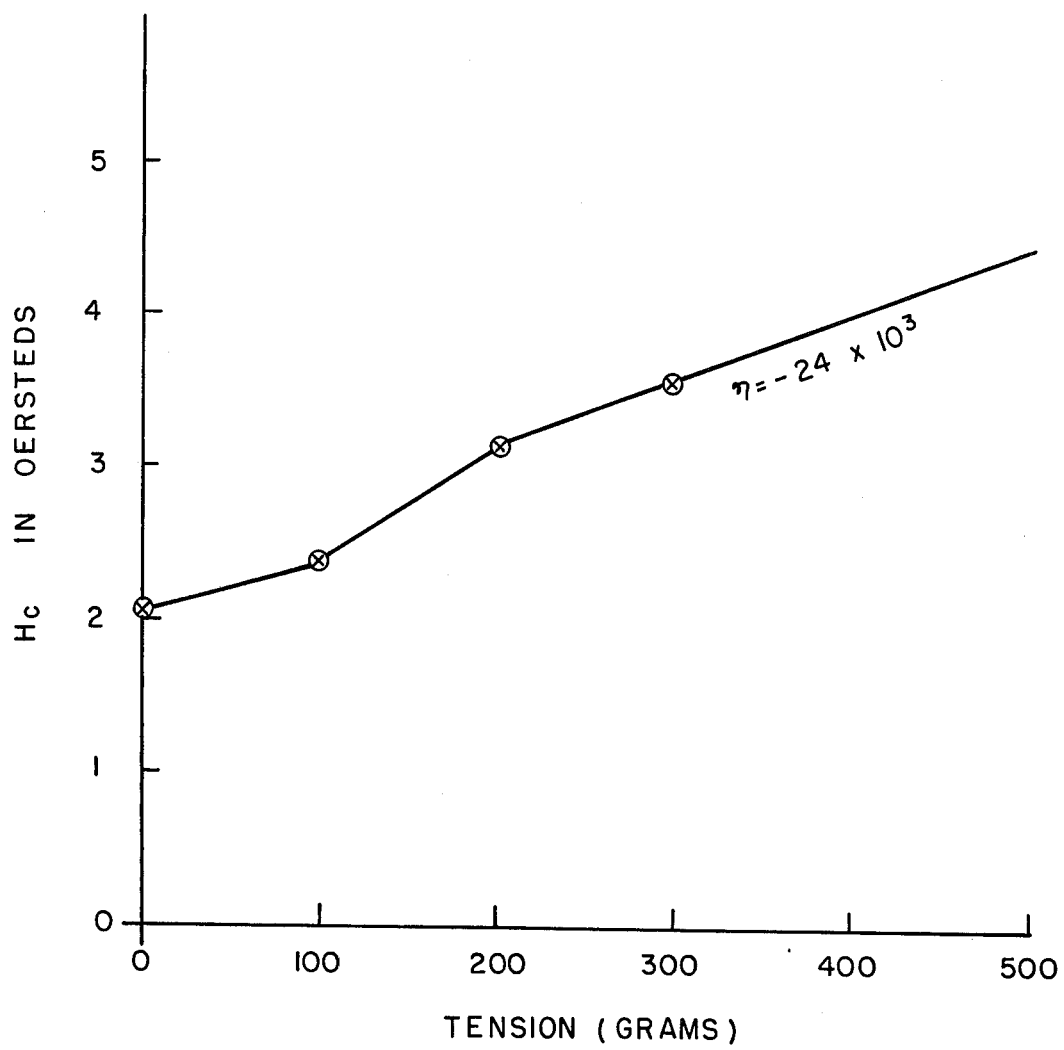
FIG. 5 is a plot of induced $H_c$ in the plated wire versus tension applied to the wire.

The effect of an adjustment in the tension of plated wire 11 is shown in FIG. 5, where the induced coercive field $H_c$ is plotted versus tension on the wire. In a strain sensitive wire, the application of tension to one having negative magnetostriction causes its coercive field $H_c$ to go up. The coercive field $H_c$ is defined (for a single domain homogeneous ideal thin anisotropic film) as that field which if increased slightly above the field at which domain wall motion begins, causes half the magnetization to be reversed. FIG. 8 is representative of the hysteresis loop of the anisotropic magnetic film described above. The lower values of $H_c$ permit magnetization reversal at lower values of applied field in the easy axis direction.

If we assume for example, a relatively low $H_c$ (original) of 2.0 Oe., as shown in FIG. 5 (curve of magnetostriction constant $\eta = -24,000$), then the application of 300 gm. wt. causes the $H_c$ (induced) to increase to approximately 4.0 Oe. and increasing the tension to 500 gm. wt. causes the $H_c$ to increase to approximately 5.0 Oe. Thus when tensional force is applied to a negative magnetostrictive wire, the $H_c$ goes up and therefore, the magnitude of the switching threshold becomes greater.

It is clearly apparent that the $H_c$ is varied as a function of tension and that by adjustment of the tension, the switching threshold of the plated wire switch can be adjusted as desired. It is seen that the switch is most sensitive under low tension.

Figure 6:
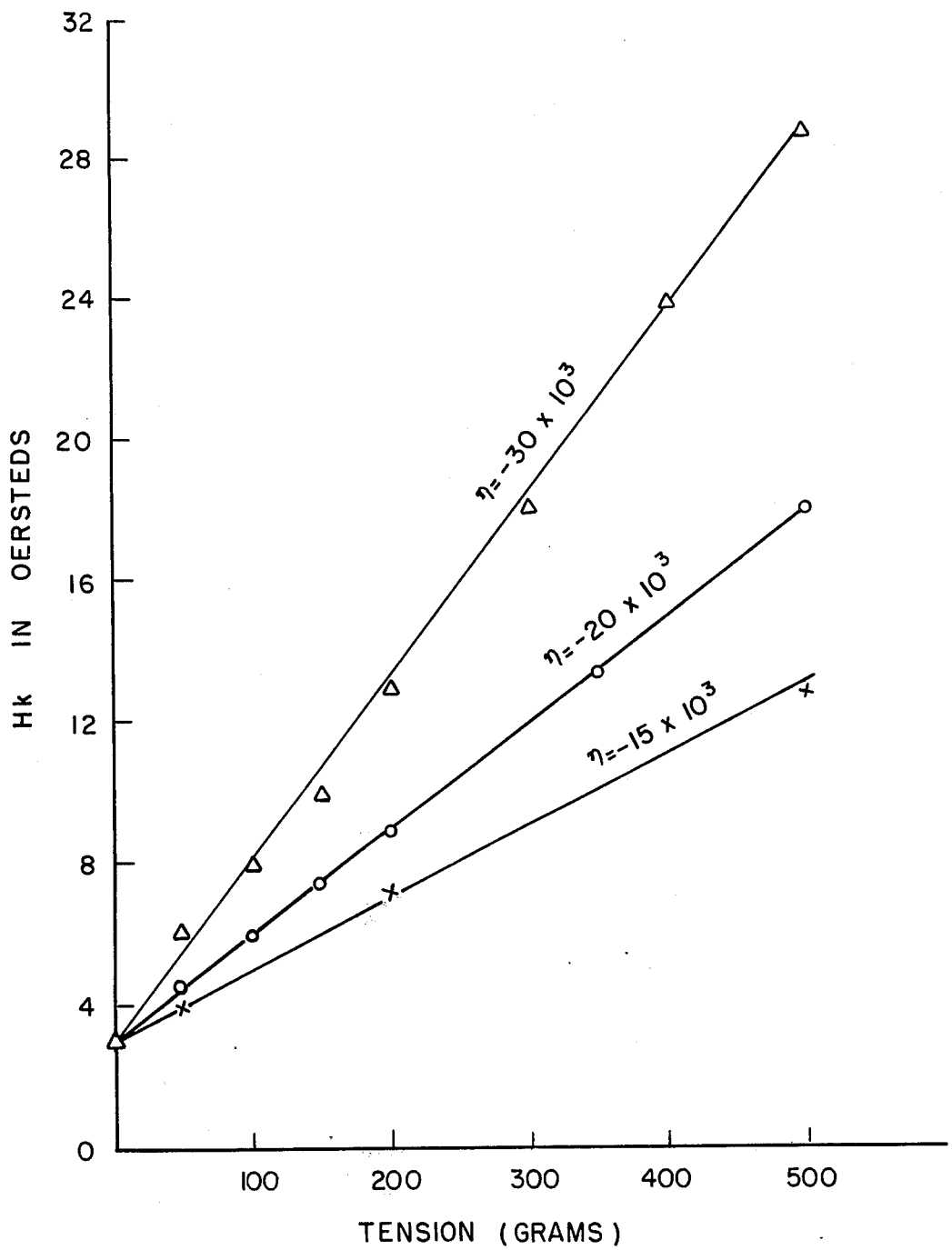
FIG. 6 is a plot of induced $H_k$ in several plated wires of differing magnetostriction tension applied to the wire.

It is also shown in FIG. 6 that the effect of tension on the anisotropy field $H_k$ of a negative magnetostrictive wire is to cause the anisotropy field $H_k$ to go up. The anisotropy field $H_k$ is defined, for a single domain homogeneous ideal thin anisotropic film, as that field necessary to rotate the magnetization vector of the domain completely to the hard axis direction. The lower values of $H_k$ permits greater oscillatory response of the magnetization vector M to the drive current.

If we assume for example, a relatively low $H_k$ (original) of 3.0 Oe., as shown in FIG. 5 (curve of $\eta = -15,000$), then the application of 100 gm. wt. causes the $K_k$ (induced) to increase to approximately 5.0 Oe. and increasing the tension to 350 gm. wt. causes the $H_k$ to increase to approximately 10.0 Oe. Thus when tensional force is applied to a negative magnetostrictive wire, the $H_k$ goes up and therefore, the oscillations of the magnetization vector become smaller. Two other curves with different magnetostrictive coefficient $\eta$ are also shown, $\eta = -20 \times 10^3$ Oe. and $\eta = -30 \times 10^3$ Oe. It is, therefore, also clear that $H_k$ is varied as a function of tension and by adjustment of tension, the oscillatory response of the magnetostrictive vector is altered. Several examples of experimental wires have been shown in FIGS. 5 and 6. These and other wires can be fabricated to satisfy design requirements of the $H_c$ and $H_k$ by varying parameters such as magnetostriction and plating bath composition.

Figure 2:
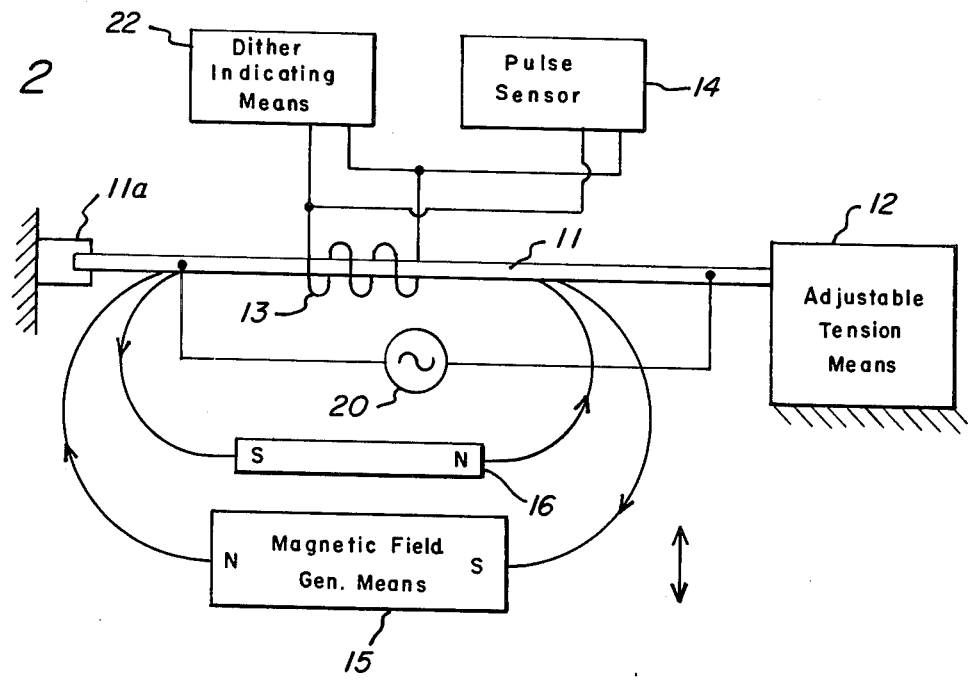
FIG. 2 shows another embodiment of the magnetic switch of this invention.

The embodiment shown in FIG. 2 is similar to FIG. 1 and also includes a miniscule alternating current source 20, in the order of a fraction of a milliampere, connected to pass the current through the length of the plated wire switch 11. The magnetization vector of the plated wire is set into a small dither type oscillation by the applied current.

The magnitude of the dither, which can be electrically sensed is a measure of the $H_k$. The magnitude of the threshold switching level is a function of $H_c$. A magnetic field parallel to the cylindrical axis of the wire is capable of sudden switching of magnetization vector orientation, resulting in flux reversal and a pulsed electrical signal. The dither also serves to monitor the continuity of the electrical system and acts as a fail-safe system.

Figure 4:
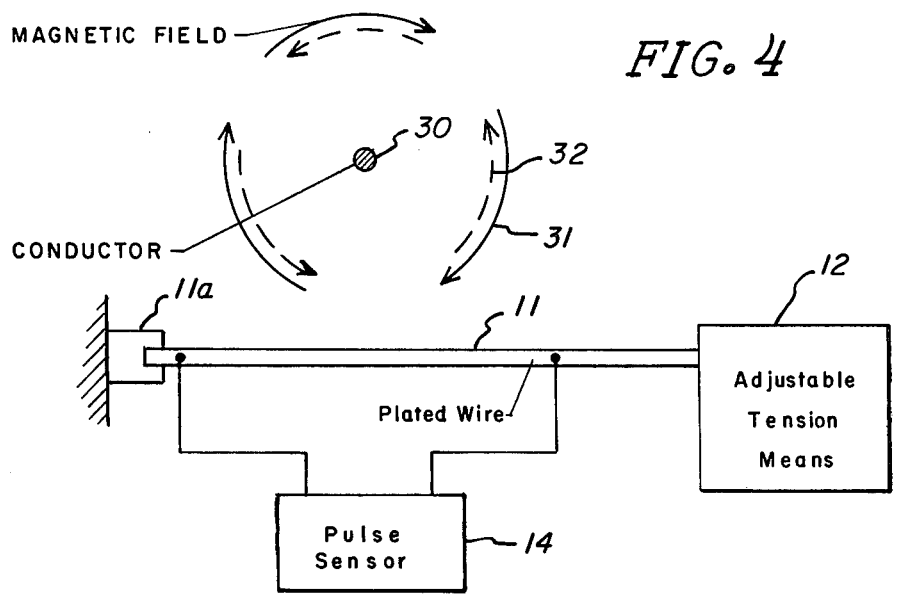
FIG. 4 shows a third embodiment of the invention.

FIG. 4 describes a system utilizing the magnetically actuated switch of this invention to detect when AC current in a nearby wire reaches a predetermined magnitude. It might be described as a fuse or overcurrent indicator. The AC current flowing in a conductor 30 results in a magnetic field around the conductor shown schematically by circular lines 31 and 32. Magnetically actuated switch 11 is spaced from the conductor 30 and is in the magnetic field generated by the current flowing in the conductor. In FIG. 4 the conductors leading to the pulse sensors 14 are shown as being directly connected to spaced apart points on the plated wire switch 11 rather than being connected to a pick-up coil 13 as set out in the earlier figures. A pick-up coil 13 may be used instead in this embodiment, if desired, and the direct connection to the plated wire switch may be used in place of the pick-up coil of the earlier described embodiments if desired.

In FIG. 4 when the amplitude of the current, and thus of the applied magnetic field, reaches a level known as the switching threshold, the magnetization of switch 11 reverses abruptly and periodically, producing a series of pulses. The pulse repetition rate corresponds to the frequency of the sensed current and the pulses continue as long as the magnetic field level reaches or exceeds the threshold. When the amplitude of the applied magnetic field falls below the threshold, for example, when the current is reduced, the pulses cease, as shown by a pulse detector. The adjustable tension means 12, again in this embodiment, allows the switching threshold of plated wire switch 11 to be adjusted or controlled to a desired value. Since the magnetic field at switch 11 of FIG. 4 is also a function of the distance between current carrying conductor 20 and switch 11, this arrangement can also find use as a proximity switch where the current is fixed and there is relative movement between conductor 30 and switch 11.

The embodiments of the invention in which an exclusive property or right is claimed are defined as follows:

1. An adjustable-threshold bistable magnetically actuated switch for generating an electrical pulse at each switching event, comprising:

a length of wire substrate having an anisotropic magnetostrictive magnetic film covering the wire substrate, the magnetic film having an easy axis of magnetization oriented helically around the wire, the helical magnetization direction being reversible by the application to said switch of external magnetic fields of predetermined magnitude to change the state of the magnetically actuated switch between a first state and a second state and to generate an electrical pulse in said wire substrate with each reversal between said states, said film covered substrate being known as a plated wire;

adjustable tension means fastened to said plated wire for maintaining said plated wire under tension, the switching threshold level of said plated wire being a function of the magnitude of the tension exerted on said plated wire; and pulse output terminals from said switch.

2. The invention according to claim 1 wherein said helical orientation is at an angle between about 15° and about 75° with respect to the axial direction.

3. The invention according to claim 1 wherein said pulse output terminals have direct connection to said plated wire.

4. The invention according to claim 1 and further comprising a pulse output coil wound around said plated wire, said coil being connected to said pulse output terminals.

* * * * *